United States Patent
Chang et al.

(10) Patent No.: US 9,773,080 B2
(45) Date of Patent: Sep. 26, 2017

(54) THERMAL SIMULATION DEVICE AND METHOD

(71) Applicant: Industrial Technology Research Institute, Hsinchu (TW)

(72) Inventors: Yeong-Jar Chang, Hsinchu County (TW); Juin-Ming Lu, Hsinchu (TW); Liang-Chia Cheng, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 2 days.

(21) Appl. No.: 14/985,204

(22) Filed: Dec. 30, 2015

(65) Prior Publication Data
US 2017/0154144 A1    Jun. 1, 2017

(30) Foreign Application Priority Data
Nov. 30, 2015    (TW) .............................. 104139869 A

(51) Int. Cl.
G06F 17/50    (2006.01)

(52) U.S. Cl.
CPC ...... G06F 17/5036 (2013.01); G06F 17/5027 (2013.01)

(58) Field of Classification Search
CPC ............. G06F 17/5027; G06F 17/5036; G06F 2217/80
USPC ...................................................... 716/109
See application file for complete search history.

(56) References Cited

U.S. PATENT DOCUMENTS

| | | | |
|---|---|---|---|
| 6,625,651 B1 | 9/2003 | Swartz et al. | |
| 6,732,167 B1 | 5/2004 | Swartz et al. | |
| 6,813,278 B1 | 11/2004 | Swartz et al. | |
| 6,836,803 B1 | 12/2004 | Swartz et al. | |

(Continued)

FOREIGN PATENT DOCUMENTS

| | | |
|---|---|---|
| TW | 506190 | 10/2002 |
| TW | 565848 | 12/2003 |

(Continued)

OTHER PUBLICATIONS

Taiwan Patent Office, Office Action, Patent Application Serial No. 104139869, dated Apr. 18, 2016, Taiwan.

(Continued)

*Primary Examiner* — Paul Dinh

(57) ABSTRACT

A thermal simulation device is applied to a transaction-level designed chip which includes a plurality of intellectual properties. The thermal simulation device includes a plurality of thermal-aware transaction-level power model circuits, a simulator, a translator and a thermal emulator. The thermal-aware transaction-level power model circuits corresponds to the respective intellectual properties, and are configured to a corresponding power information for each of the intellectual properties, and dynamically adjusts the power information according to temperature information. The simulator is configured to generate the corresponding temperature information of the intellectual properties according to compatible information. The translator is configured to generate the compatible information which is compatible with the simulator. The thermal emulator is configured to trigger the simulator and transmit the temperature information to the intellectual properties.

24 Claims, 8 Drawing Sheets

(56) References Cited

U.S. PATENT DOCUMENTS

| | | | |
|---|---|---|---|
| 6,961,778 | B2 | 11/2005 | Swartz et al. |
| 7,472,363 | B1 | 12/2008 | Chandra |
| 7,772,880 | B2 | 8/2010 | Solomon |
| 8,020,124 | B2 | 9/2011 | Alexanian et al. |
| 8,286,111 | B2 | 10/2012 | Chandra et al. |
| 8,539,408 | B1 | 9/2013 | Cheng et al. |
| 2003/0074463 | A1 | 4/2003 | Swartz et al. |
| 2006/0031794 | A1* | 2/2006 | Li .................. G06F 17/5009 716/111 |
| 2007/0201442 | A1* | 8/2007 | Hekmatpour ....... H04L 12/4633 370/356 |
| 2007/0240092 | A1* | 10/2007 | Lee .................. H01L 25/18 438/129 |
| 2007/0244676 | A1* | 10/2007 | Shang .............. G06F 17/5018 703/2 |
| 2009/0024347 | A1* | 1/2009 | Chandra ........... G06F 17/5036 702/130 |
| 2009/0066366 | A1 | 3/2009 | Solomon |
| 2011/0055778 | A1* | 3/2011 | Chen ................ G06F 17/504 716/106 |
| 2011/0113392 | A1* | 5/2011 | Chakraborty ....... G06F 17/505 716/102 |
| 2011/0249014 | A1 | 10/2011 | Kolstad et al. |
| 2012/0116735 | A1 | 5/2012 | Guedon et al. |
| 2012/0256271 | A1* | 10/2012 | Wei .................. H01L 27/0629 257/379 |
| 2013/0054202 | A1* | 2/2013 | Carlsen ............ G06F 17/5036 703/2 |
| 2013/0305194 | A1* | 11/2013 | Wang .............. G06F 17/5081 716/52 |

FOREIGN PATENT DOCUMENTS

| | | |
|---|---|---|
| TW | 200606623 | 2/2006 |
| TW | 201216163 | 4/2012 |
| TW | 201224748 | 6/2012 |
| TW | 201243620 | 11/2012 |

OTHER PUBLICATIONS

Federico Terraneo et al., "An accurate simulation framework for thermal explorations and optimizations," Proceedings of the 2015 Workshop on Rapid Simulation and Performance Evaluation: Methods and Tools, Jan. 2015, 6 pages, ACM, US.

Ziabari, A. et al., " Fast Thermal Simulators for Architecture Level Integrated Circuit Design," Semiconductor Thermal Measurement and Management Symposium (Semi-Therm), Mar. 2011, pp. 70-75, IEEE, US.

Huang et al., "Full-Chip Thermal Analysis for the Early Design Stage via Generalized Integral Transforms," Very Large Scale Integration (VLSI) Systems, Mar. 2009, pp. 613-626, vol. 17, Issue 5, IEEE, US.

Zhan et al., "High efficiency Green function-based thermal simulation algorithms," Computer-Aided Design of Integrated Circuits and Systems, Sep. 2007, pp. 1661-1675, vol. 26, Issue 9, IEEE, US.

Huang et al., "HotSpot: A compact thermal modeling methodology for early-stage VLSI design," Very Large Scale Integration (VLSI) Systems, Mar. 2006, pp. 1063-8210, vol. 14, Issue 5, IEEE, US.

Yang et al., "ISAC: Integrated Space and Time Adaptive Chip-Package Thermal Analysis," Computer-Aided Design of Integrated Circuits and Systems, Jan. 2007, pp. 1-13, vol. 26, Issue 1, IEEE, US.

Jie Meng et al., "Optimizing Energy Efficiency of 3-D Multicore Systems with Stacked DRAM Under Power and Thermal Constraints," Proceedings of the 49th Annual Design Automation Conference, Mar. 2012, pp. 648-655, ACM, US.

Lung et al., "Thermal analysis experiences of a tri-core SoC system," Green Circuits and Systems (ICGCS), Jun. 2010, pp. 589-594, IEEE, US.

Xie et al., "Therminator: A Thermal Simulator for Smartphones Producing Accurate Chip and Skin Temperature Maps," Low Power Electronics and Design (ISLPED), Aug. 2014, pp. 117-122, IEEE, US.

* cited by examiner

| P11, T11 (25%) | P12, T12 (40%) |
|---|---|
| P13, T13 (10%) | P14, T14 (25%) |

FIG. 3B

```
R1_2 N1 N2 valr1_2
C1_2 N1 N2 valc1_2
R1_3 N1 N3 valr1_3
C1_3 N1 N3 valc1_3
R2_3 N2 N3 valr2_3
C2_3 N2 N3 valc2_3
......
```

THERMAL SIMULATION DEVICE AND METHOD

CROSS REFERENCE TO RELATED APPLICATIONS

This Application claims priority of Taiwan Patent Application No. 104139869, filed on Nov. 30, 2015, the entirety of which is incorporated by reference herein.

BACKGROUND

Technical Field

The disclosure generally relates to a transaction-level simulation technology, and relates to a transaction-level thermal simulation device and method.

Background

As the complexity of chip designs increases, product-development schedules in the traditional register-transfer level (RLT) are becoming longer and longer. In addition, current chip designs call for high integration between hardware and software, and as a result, the schedule of the software is added to the product-development schedule. Traditional register-transfer level methods can't provide the required simulation environment for the software in the preliminary design of the hardware design. Therefore, the Electronic System Level (ESL) method needs to be adopted to reduce the schedule of the hardware and the software. Reusing the Electronic System Level model is becoming more and more popular to transform the Electronic System Level model to a register-transfer level using a High-Level Synthesis tool.

It has been confirmed that the Electronic System Level method can effectively reduce the schedule of the hardware and software and increase the benefits in terms of the Time-to-Market of the product. In addition, as the complexity of system design increases, there are more and more concerns that relate to the problems with temperature. In the preliminary design, the designer needs to consider and plan for the cost, performance, and power consumption of the design. The designer also needs to simulate the effects of temperature variation, the effects of the element maybe burning out, and make a determination about whether to add a heat-removal mechanism, whether to change the layout of the design, whether to adjust the voltage and frequency, and host of other design issues.

In addition, power consumption is an important problem in chip design. As the complexity of system design increases, power consumption may become a key factor in system performance and cost. Therefore, it is important that power-consumption estimates be made early on in the design stage and in higher design level (e.g. transaction-level).

However, although power consumption can be estimated at the current transaction-level, it is not easy to perform a thermal simulation because of the complex algorithms involved and the thermal simulation software (ANSYS-Icepak and Metor-FloTHERM) required. The complex algorithms and thermal simulation software incur a high cost, require a lengthy computation time, and their capacity is often not sufficient. As a result, they are not suitable for performing a thermal simulation at the transaction-level. Therefore, how to increase the efficiency and performance of the thermal simulation at the transaction-level is a subject worthy of discussion.

SUMMARY

A thermal simulation device and method in transaction-level are provided to overcome the aforementioned problems.

An embodiment of the disclosure provides a thermal simulation device. The thermal simulation device is applied to a transacting-level designed chip, wherein the chip includes a plurality of intellectual properties. The thermal simulation device comprises a plurality of thermal-aware transaction-level power model circuits, a simulator, a translator and a thermal emulator. The plurality of thermal-aware transaction-level power model circuits corresponds to the plurality of intellectual properties. The plurality of thermal-aware transaction-level power model circuits is configured to generate power information corresponding to the plurality of intellectual properties, and dynamically adjust the power information according to temperature information. The simulator is configured to generate the temperature information corresponding to the plurality of intellectual properties according to compatible information. The translator is configured to generate information which is compatible with the simulator. The thermal emulator is configured to trigger the simulator and transmit the temperature information to the intellectual properties.

An embodiment of the disclosure provides a thermal simulation method. The thermal simulation method is applied to a transacting-level designed chip, wherein the chip includes a plurality of intellectual properties. The thermal simulation method comprises the steps of generating, by a plurality of thermal-aware transaction-level power model circuits, power information corresponding to the plurality of intellectual properties; generating the compatible information which is compatible with a simulator; generating the temperature information corresponding to the plurality of intellectual properties according to compatible information; transmitting the temperature information to the intellectual properties; and dynamically adjusting the power information according to temperature information.

Other aspects and features of the disclosure will become apparent to those with ordinary skill in the art upon review of the following descriptions of specific embodiments of user equipment, devices and methods.

BRIEF DESCRIPTION OF THE DRAWINGS

The disclosure will become more fully understood by referring to the following detailed description with reference to the accompanying drawings, wherein:

FIG. 3A is a schematic diagram of an intellectual property designed by a coarse method according to an embodiment of the disclosure;

FIG. 3B is a schematic diagram of an intellectual property designed by a fine-grid method according to another embodiment of the disclosure;

DESCRIPTION OF THE EMBODIMENTS

This description is made for the purpose of illustrating the general principles of the disclosure and should not be taken in a limiting sense. The scope of the disclosure is best determined by reference to the appended claims.

Figure 1:
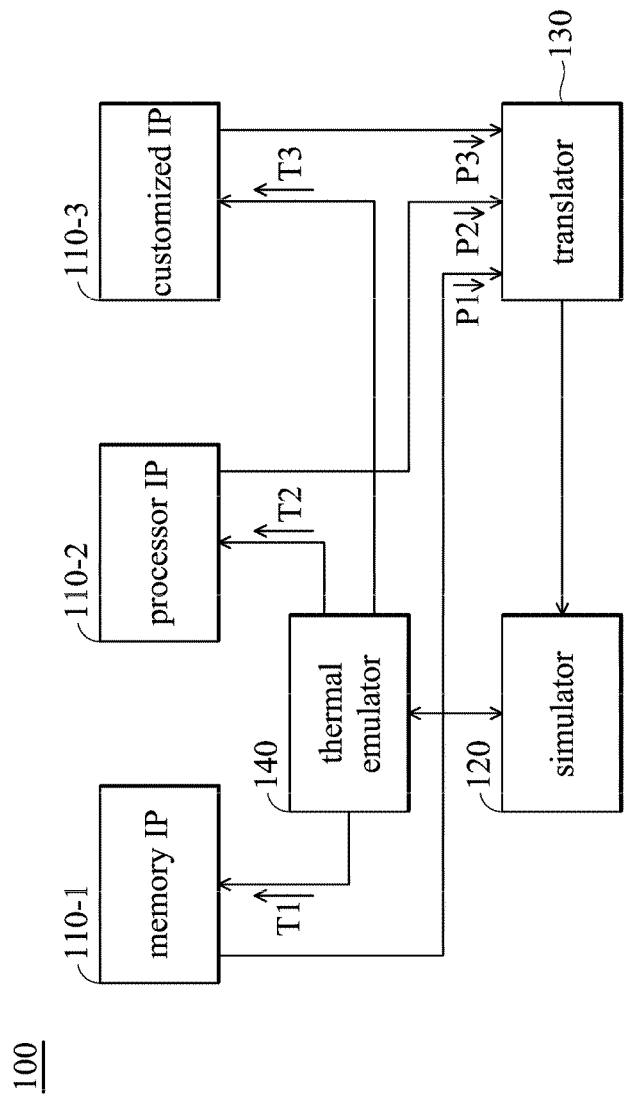
FIG. 1 is a block diagram illustrating the thermal simulation device 100 according to an embodiment of the disclosure.

FIG. 1 is a block diagram illustrating the thermal simulation device 100 according to an embodiment of the disclosure. The thermal simulation device 100 is applied to a transacting-level chip, wherein the chip includes a plurality of intellectual properties (IPs), such as a memory IP, processor IP, encode IP, decode IP or customized IP (CIP), but the disclosure should not be limited thereto.

As shown in FIG. 1, the thermal simulation device 100 includes a memory IP 110-1, a processor IP 110-2, and a customized IP 110-3. In an embodiment of the disclosure, each of the memory IP 110-1, the processor IP 110-2 and the customized IP 110-3 comprises individual thermal-aware transaction-level power model (TLPM) circuit (not shown in figure), or the memory IP, processor IP and customized IP 110-3 can be regarded as different respective thermal-aware transaction-level power model circuits (not shown in figure). In addition, the thermal simulation device 100 further includes a simulator 120, a translator 130 and a thermal emulator 140. It should be noted that the block diagram shown in FIG. 1 is for the purpose of simplicity and clarity. However, the disclosure should not be limited to what is shown in FIG. 1. The thermal simulation device 100 can also comprise other different intellectual properties and other elements.

In an embodiment of the disclosure, the individual thermal-aware transaction-level power model circuits of the memory IP 110-1, the processor IP 110-2 and the customized IP 110-3 can respectively generate the power information $P_1$, $P_2$ and $P_3$ corresponding to the memory IP 110-1, the processor IP 110-2 and the customized IP 110-3 respectively, and transmit the power information $P_1$, $P_2$ and $P_3$ to the translator 130.

Figure 2:
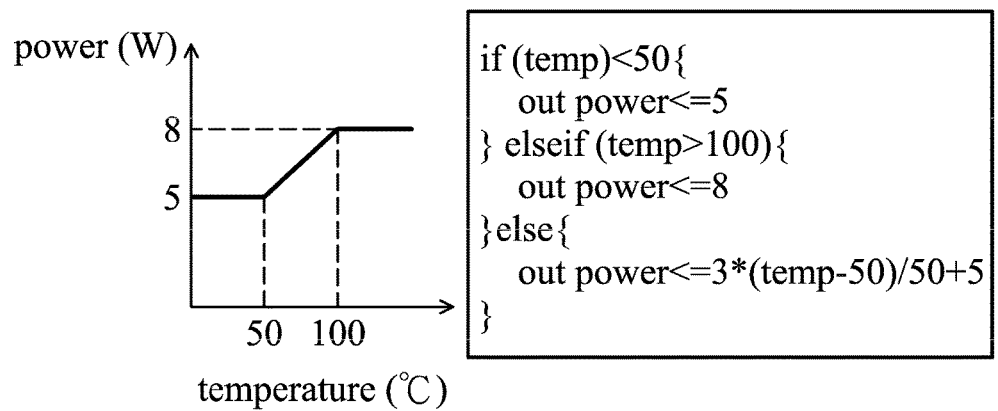
FIG. 2 is a schematic diagram illustrating the thermal codes according to an embodiment of the disclosure.

In an embodiment of the disclosure, each of the thermal-aware transaction-level power model circuits may comprise related thermal codes. FIG. 2 is a schematic diagram illustrating the thermal codes according to an embodiment of the disclosure. Taking FIG. 2 for example, if the characterization process of temperature has been performed, when the temperature is lower than 50° C., the power of a thermal-aware transaction-level power model circuit is 5 W, and when the temperature is higher than 100° C., the power of this thermal-aware transaction-level power model circuit is 8 W, and when the temperature is in 50-100° C., the power and temperature will have a linear relationship. Therefore, as shown in FIG. 2, the relationship between the power and temperature corresponding to this thermal-aware transaction-level power model circuit can be written into the thermal codes, and the thermal codes may be stored in this thermal-aware transaction-level power model circuit. In an embodiment of the disclosure, each of the thermal-aware transac-tion-level power model circuits can generate the power information according to its related thermal codes and the temperature information provided by the thermal emulator 140.

Figures 3A, 3B:
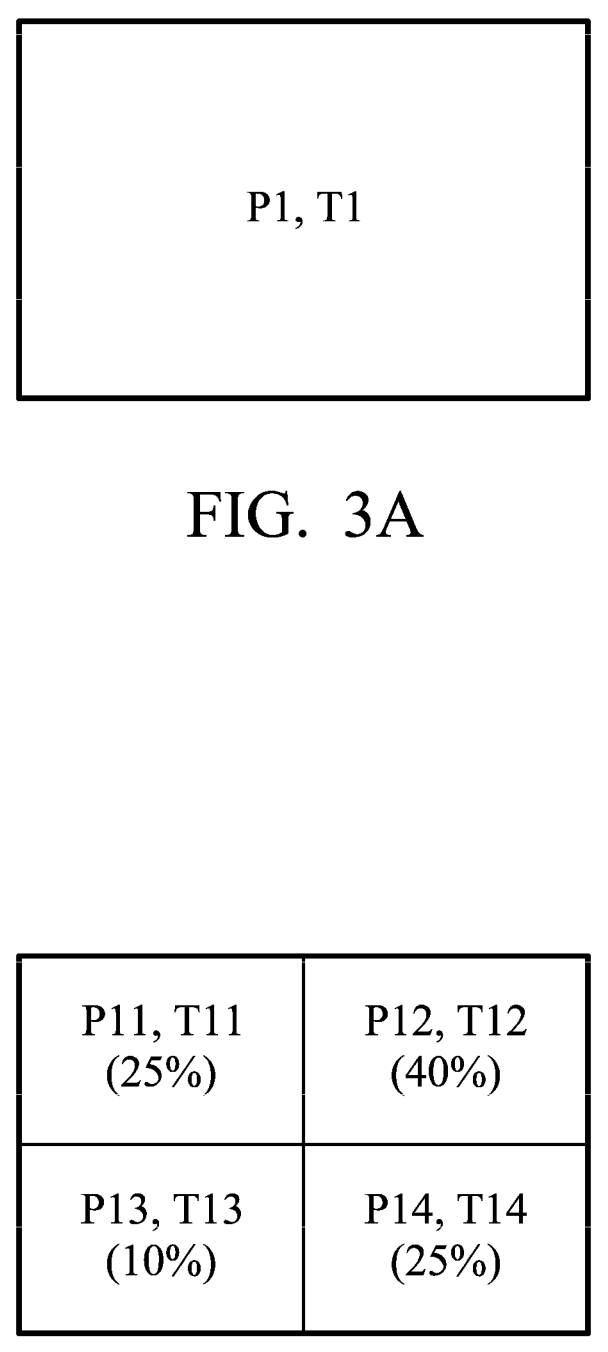

In an embodiment of the disclosure, each of the intellectual properties may be divided in to a plurality of grids in advance, wherein each of the grids can correspond to the same or different power weighting. Taking FIGS. 3A-3B for example, when an intellectual property has been pre-analyzed, if the temperature and power of intellectual property distribute uniformly (as shown in FIG. 3A), the intellectual property will be designed by a coarse method. If the temperature and power of intellectual property are not distributed uniformly (as shown in FIG. 3B, each of the grids may correspond to different power weighting), the intellectual property will be designed by a fine-grid method (i.e. this intellectual property will be divided into a plurality of grids).

In an embodiment of the disclosure, when it is determined whether each of the intellectual properties need to be divided into a plurality of grids in advance, a first maximum temperature difference corresponding to the first number (e.g. 1*1) of grids of each of the intellectual properties will be computed and a second maximum temperature difference corresponding to the second number (e.g. 2*2) of grids of each of the intellectual properties will be computed, wherein the second number is larger than the first number. Then, a first difference between the first maximum temperature difference and the second maximum temperature difference will be computed, and the first difference is determined whether larger than a threshold. When the first difference is less than or equal to the threshold, the first number will be adopted. When the first difference is greater than the threshold, a third maximum temperature difference corresponding to the third number (e.g. 4*4) of grids of each of the intellectual properties will be computed, wherein the third number is larger than the second number. Then, a second difference between the second maximum temperature difference and the third maximum temperature difference will be computed, and it is determined whether the second difference is greater than the threshold. Then, the process will be performed accordingly until the difference is less than or equal to the threshold. In an embodiment of the disclosure, each of the maximum temperature differences corresponding to different numbers of the grids is defined as the temperature difference between the highest temperature and the lowest temperature when the intellectual property is divided into the corresponding number of grids.

Figure 4:
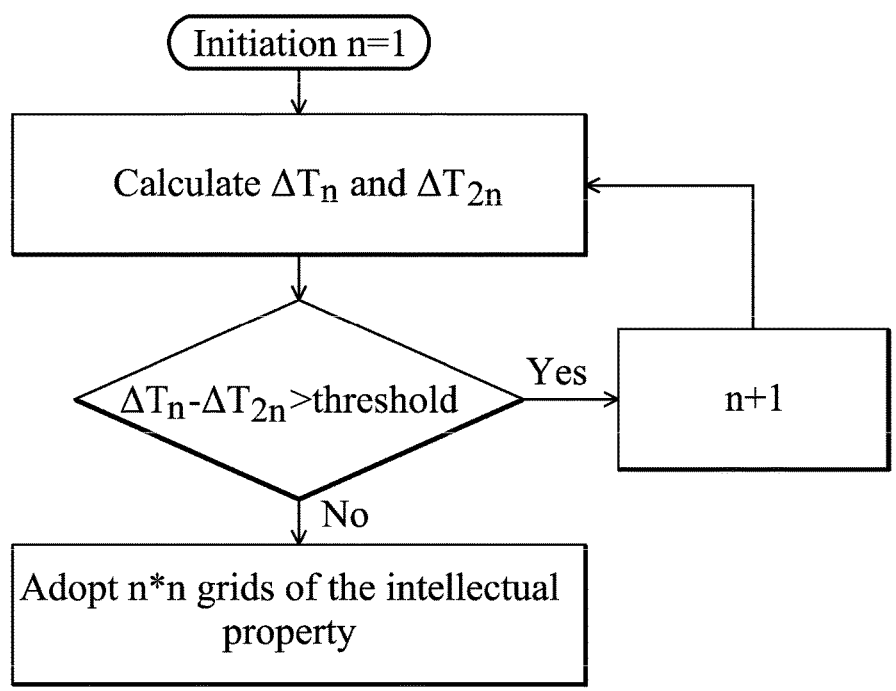
FIG. 4 is a schematic diagram of an algorithm for dividing an intellectual property into girds according to an embodiment of the disclosure.

In an embodiment of the disclosure, the above process can be applied to an algorithm, but the disclosure should not be limited thereto. The flow of the algorithm is shown in FIG. 4, wherein in FIG. 4 the $\Delta T_m$ is defined as a maximum temperature difference corresponding to m*m grids of an intellectual property, and the maximum temperature is defined as $\Delta T = T_{max} - T_{min}$, wherein $T_{max}$ is defined as the highest temperature of the intellectual property, and $T_{min}$ is defined as the lowest temperature of the intellectual property. In initiation, the n is set to 1, that is to say, the maximum temperature difference $\Delta T_1$ corresponding to the 1*1 grids of the intellectual property will be computed and the second maximum temperature difference $\Delta T_2$ corresponding to the 2*2 grids of the intellectual property will be computed first. Then, the difference between the maximum temperature difference $\Delta T_1$ and the maximum temperature difference $\Delta T_2$ will be computed, and the difference will be determined whether larger than a threshold. When the difference is not greater than the threshold, the 1*1 grids of the intellectual property will be adopted. When the difference is greater than the threshold, the n is set to 2. As discussion above, the maximum temperature difference $\Delta T_2$ corresponding to the 2*2 grids of the intellectual property will be computed, and the maximum temperature difference $\Delta T_4$ corresponding to the 4*4 grids of the intellectual property will be computed. Then, the difference between the maximum temperature difference $\Delta T_2$ and the maximum temperature difference $\Delta T_4$ will be computed, and it will be determined whether the difference is greater than the threshold. When the difference is not greater than the threshold, the 2*2 grids of the intellectual property will be adopted. When the difference is greater than the threshold, the process will be performed accordingly.

In an embodiment of the disclosure, each of the thermal-aware transaction-level power model circuits may adopt a coarse or fine-grid design method by determining whether the corresponding intellectual property is divided into multiple grids.

In an embodiment of the disclosure, each of the thermal-aware transaction-level power model circuits further comprises a look-up table. In an embodiment of the disclosure, the look-up table of each thermal-aware transaction-level power model circuit is established according to the relationship between temperature and power of each thermal-aware transaction-level power model circuit. In an embodiment of the disclosure, when one of the thermal-aware transaction-level power model circuits obtains temperature information, this thermal-aware transaction-level power model circuit can obtain the power information corresponding to the temperature information according to the look-up table.

In an embodiment of the disclosure, when translator 130 obtains the power information $P_1$, $P_2$ and $P_3$, the translator 130 will transform the power information $P_1$, $P_2$ and $P_3$ to the compatible information which is compatible with the simulator 120. In an embodiment of the disclosure, the simulator 120 is a SPICE-like Simulation Engine, such as a PSPICE Simulation Engine, a HSPICE Simulation Engine, a Spectra Simulation Engine, or a Nexxim SPICE Simulation Engine, but the disclosure should not be limited thereto. In an embodiment of the disclosure, the translator 130 may generate a resistor-capacitor network of each intellectual property according to the floorplane and material of each intellectual property, and generate parameter information corresponding to the resistor-capacitor network according to the resistor-capacitor network, wherein the parameter information is compatible with the simulator 120. Details will be discussed in FIG. 5 below.

Figures 5, 6:
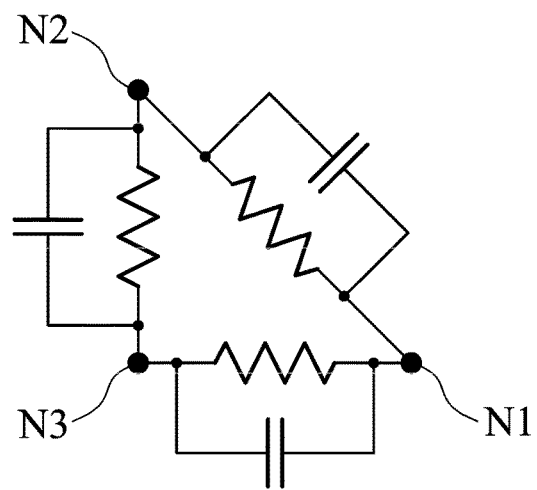
FIG. 5 is a schematic diagram illustrating the thermal resistor-capacitor transformation according to an embodiment of the disclosure.
FIG. 6 is a schematic diagram illustrating the parameter information according to an embodiment of the disclosure.

FIG. 5 is a schematic diagram illustrating the thermal resistor-capacitor transformation according to an embodiment of the disclosure. As shown in FIG. 5, the translator 130 may generate the resistor-capacitor networks respectively corresponding to the memory IP 110-1, the processor IP 110-2 and the customized IP 110-3 according to the floorplanes and materials of the memory IP 110-1, the processor IP 110-2 and the customized IP 110-3, wherein the node N1 corresponds to the memory IP 110-1, the node N2 corresponds to the processor IP 110-2, the node N3 corresponds to the customized IP 110-3. Then, the translator 130 will generate the parameter information corresponding to the resistor-capacitor networks according to the resistor-capacitor networks. FIG. 6 is a schematic diagram illustrating the parameter information according to an embodiment of the disclosure, wherein R1_2 N1 N2 valr1_2 is defined as the thermal resistance value between the node N1 and the node N2, and C1_2 N1 N2 valc1_2 is defined as the thermal capacitance value between the node N1 and the node N2. Accordingly, R1_3 N1 N3 valr1_3 is defined as the thermal resistance value between the node N1 and the node N3, C1_3 N1 N3 valc1_3 is defined as the thermal capacitance value between the node N1 and the node N3, R2_3 N2 N3 valr2_3 is defined as the thermal resistance value between the node N2 and the node N3, and C2_3 N2 N3 valc2_3 is defined as the thermal capacitance value between the node N2 and the node N3.

Figure 7:
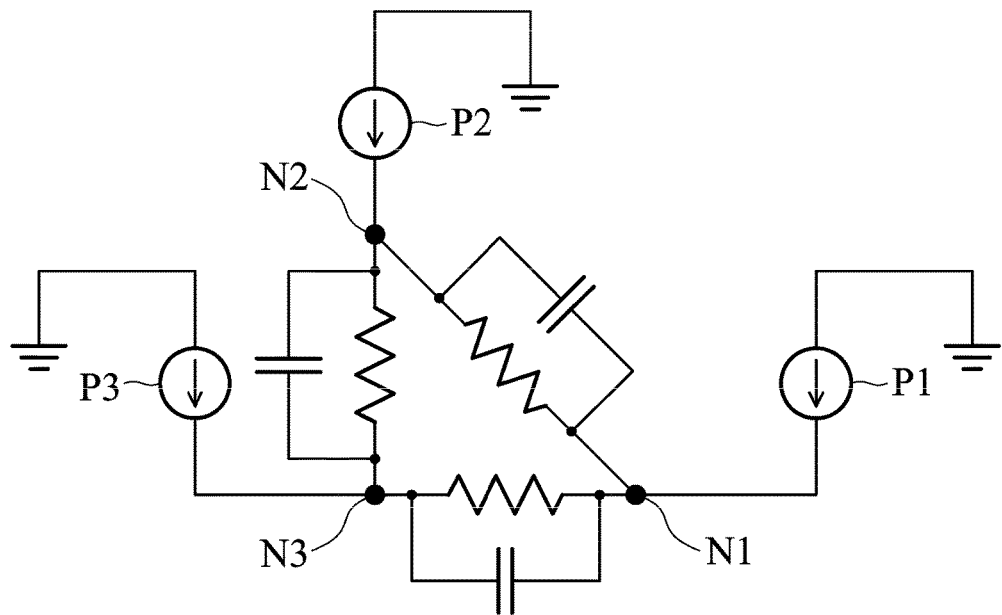
FIG. 7 is a schematic diagram illustrating the transformation between the power information and current information according to an embodiment of the disclosure.

In an embodiment of the disclosure, the translator 130 may also transform the power information $P_1$, $P_2$ and $P_3$ to current information. FIG. 7 is a schematic diagram illustrating the transformation between the power information and current information according to an embodiment of the disclosure. As shown in FIG. 7, the translator 130 may input the power information $P_1$, $P_2$ and $P_3$ to the function of FIG. 7 to obtain the current information corresponding to the memory IP 110-1, the processor IP 110-2 and the customized IP 110-3, wherein $T_{ij}$ is indicated as time, $P_{ij}$ is indicated as power, i is the serial number of the intellectual property, j is the serial number of the time point, and PWL is the specific function format of the SPICE. Therefore, Isource1 Iprocessor 0 PWL (T11 P11 T12 P12) is regarded as the current information of the memory IP 110-1, Isource2 Imemory 0 PWL (T21 P21 T22 P22 . . . ) is regarded as the current information of the processor IP 110-2, and Isource3 ICIP 0 PWL (T31 P31 T32 P32 . . . ) is regarded as the current information of the customized IP 110-3. The compatible information of the disclosure comprises the parameter information and the current information generated by the translator 130.

When the thermal simulation is performed, the thermal emulator 140 may trigger the simulator 120. When the simulator 120 is triggered, the simulator 120 will perform simulation according to the compatible information to generate the temperature information $T_1$, $T_2$ and $T_3$ corresponding to the memory IP 110-1, the processor IP 110-2 and the customized IP 110-3 respectively. Then, the simulator 120 will transmit the temperature information $T_1$, $T_2$ and $T_3$ to the thermal emulator 140. The thermal emulator 140 will respectively transmit the temperature information $T_1$, $T_2$ and $T_3$ to the memory IP 110-1, the processor IP 110-2 and the customized IP 110-3. When the memory IP 110-1, the processor IP 110-2 and the customized IP 110-3 obtain the temperature information $T_1$, $T_2$ and $T_3$, the memory IP 110-1, the processor IP 110-2 and the customized IP 110-3 will generate new power information according to the temperature information $T_1$, $T_2$ and $T_3$ to substantially real-time and dynamically adjust and update the temperature and power.

In an embodiment of the disclosure, the thermal simulation device 100 further comprises a decision circuit. The decision circuit is configured to determine the chip is a 2 dimension (2D) chip or a 3 dimension (3D) chip. In an embodiment of the disclosure, when the chip is a 2D chip, the thermal simulation device 100 will perform a traditional simulation method, such as numerical method, an analytical method, and so on. When the chip is a 3D chip, the thermal simulation device 100 will perform the thermal simulation method provided in the disclosure.

In an embodiment of the disclosure, the thermal simulation device 100 can be applied to different designed models for different time-levels, such as Cycle Accurate (CA), Programmer View with Timing (PVT), Programmer View (PV), untimed, and so on.

Figure 8:
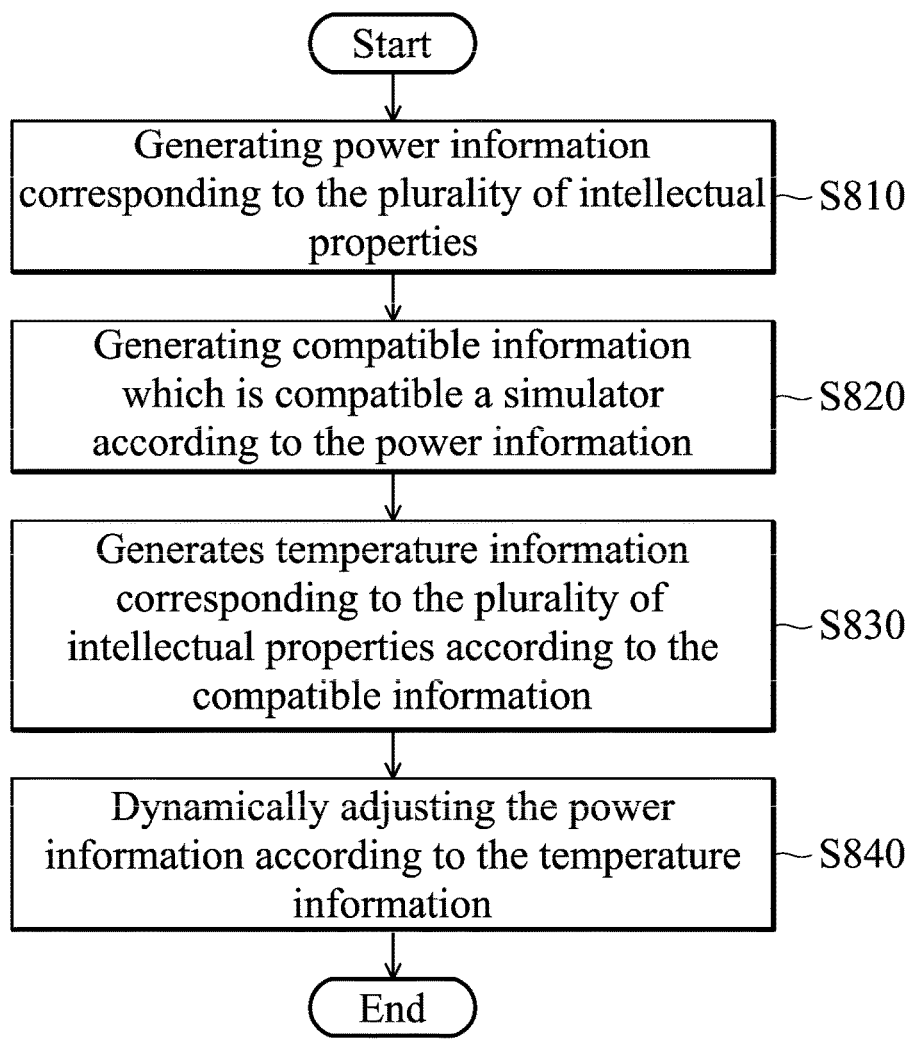
FIG. 8 is a flowchart 800 of a thermal simulation method according to an embodiment of the disclosure.

FIG. 8 is a flowchart 800 of a thermal simulation method according to an embodiment of the disclosure. The thermal simulation method is applied to a transacting-level chip, wherein the chip includes a plurality of intellectual properties (e.g. the memory IP 110-1, the processor IP 110-2 and the customized IP 110-3). As shown in FIG. 8, in step S810, a plurality of thermal-aware transaction-level power model circuits of the thermal simulation device 100 respectively generate power information corresponding to the plurality of intellectual properties. In step S820, the thermal simulation device 100 generates compatible information which is compatible a simulator (e.g. a PSPICE Simulation Engine, a HSPICE Simulation Engine, a Spectra Simulation Engine, or a Nexxim SPICE Simulation Engine) according to the power information. In step S830, the thermal simulation device 100 generates temperature information corresponding to the plurality of intellectual properties according to the compatible information. In step S840, the thermal simulation device 100 transmits individual temperature information to the plurality of intellectual properties and dynamically adjusts the power information according to the temperature information.

In an embodiment of the disclosure, step S810, the method further comprises each of the thermal-aware transaction-level power model circuits generating power information according to the temperature information through a thermal code.

In an embodiment of the disclosure, each of the intellectual properties may be pre-divided into multiple grids, and each of the grids corresponds to the same or different power weighting. Therefore, in step S810, the method further comprises the thermal simulation device 100 adopting the coarse or fine-grid design method by determining whether the intellectual property is divided into multiple grids.

In an embodiment of the disclosure, in step S810, the method further comprises the thermal simulation device 100 pre-establishing a look-up table of each thermal-aware transaction-level power model circuit according to the relationship between temperature and power of each thermal-aware transaction-level power model circuit, and obtaining the power information according to the look-up table.

In an embodiment of the disclosure, in step S820, the method further comprises the thermal simulation device 100 generating a resistor-capacitor network of each intellectual property according to the floorplane and material of each intellectual property, and generating parameter information corresponding to the resistor-capacitor network according to the resistor-capacitor network.

In an embodiment of the disclosure, after step S810, the thermal simulation device 100 may determine the chip is a 2 dimension (2D) chip or a 3 dimension (3D) chip. When the chip is a 2D chip, the thermal simulation device 100 will perform a traditional simulation method, such as numerical method, an analytical method, and so on.

Figure 9:
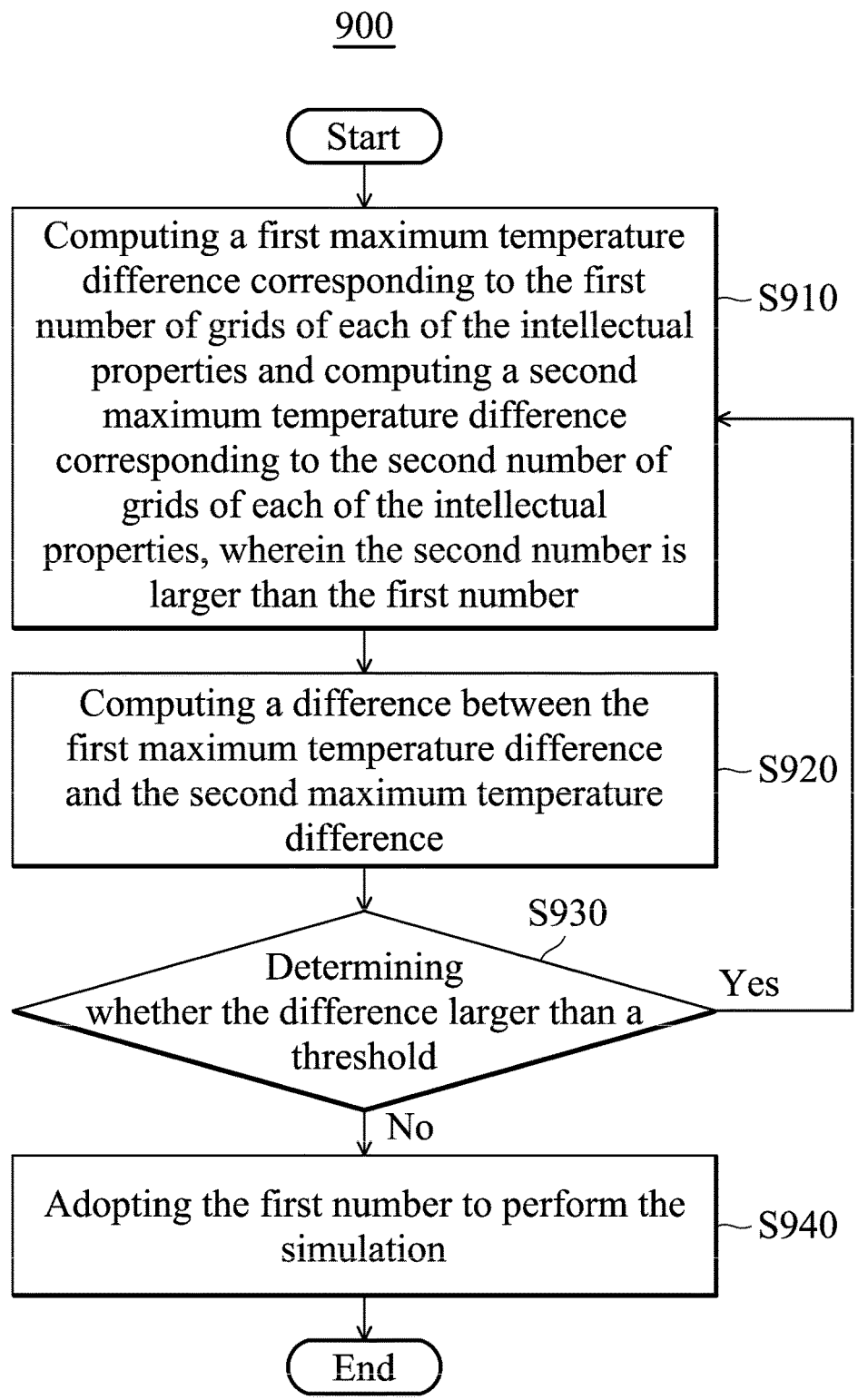
FIG. 9 is a flowchart 900 of a thermal simulation method for dividing each intellectual property into multiple grids according to an embodiment of the disclosure.

FIG. 9 is a flowchart 900 of a thermal simulation method for dividing each intellectual property into multiple grids according to an embodiment of the disclosure. The thermal simulation method is applied to a transacting-level chip, wherein the chip includes a plurality of intellectual properties (e.g. the memory IP 110-1, the processor IP 110-2 and the customized IP 110-3). As shown in FIG. 9, in step S910, a first maximum temperature difference corresponding to the first number of grids of each of the intellectual properties will be computed and a second maximum temperature difference corresponding to the second number of grids of each of the intellectual properties will be computed, wherein the second number is larger than the first number. In step S920, a difference (first difference) between the first maximum temperature difference and the second maximum temperature difference will be computed. In step S930, the difference is determined whether is larger than a threshold. When the difference is less than or equal to the threshold, step S940 is performed. In step S940, the first number will be adopted to perform the simulation. When the difference is greater than the threshold, the method will return to step S910. In step S910, a third maximum temperature difference corresponding to the third number of grids of each of the intellectual properties will be computed, wherein the third number is larger than the second number. Then, in step S920, a difference (second difference) between the second maximum temperature difference and the third maximum temperature difference will be computed. Then, in step S930, a determination is made as to whether the difference is greater than the threshold. When the difference is less than or equal to the threshold, the second number will be adopted. When the first difference is greater than the threshold, the method will return to step S910 again.

According to the thermal simulation method of the disclosure, the original simulation between the temperature and power can be transform to the simulation between the voltage and current. According to the thermal simulation method of the disclosure, after the appropriate design and the format transformation, a transaction-level thermal simulation can be performed by the SPICE-like Simulation Engine and the temperature and power information can be substantially and dynamically adjusted and updated in real-time. In addition, SPICE has been a popular simulation tool for electronic circuits, and it has a powerful matrix-computation ability and high-speed simulation ability. Therefore, the thermal simulation method of the disclosure will not adopt other algorithms and thermal simulation software with higher computational complexity.

The steps of the method described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such that the processor can read information (e.g., code) from and write information to the storage medium. A sample storage medium may be integral to the processor. The processor and the storage medium may reside in an ASIC. The ASIC may reside in user equipment. Alternatively, the processor and the storage medium may reside as discrete components in user equipment. Moreover, in some aspects any suitable computer-program product may comprise a computer-readable medium comprising codes relating to one or more of the aspects of the disclosure. In some aspects a computer program product may comprise packaging materials.

Reference throughout this specification to "one embodiment" or "an embodiment" means that a particular feature, structure, or characteristic described in connection with the embodiment is included in at least one embodiment of the disclosure, but does not denote that they are present in every embodiment. Thus, the appearances of the phrases "in one embodiment" or "in an embodiment" in various places throughout this specification are not necessarily referring to the same embodiment of the disclosure. Furthermore, the particular features, structures, or characteristics may be combined in any suitable manner in one or more embodiments. Furthermore, the figures of the disclosure are only for illustration and are not drawn to scale.

The above paragraphs describe many aspects. Obviously, the teaching of the disclosure can be accomplished by many methods, and any specific configurations or functions in the disclosed embodiments only present a representative condition. Those who are skilled in this technology can understand that all of the disclosed aspects in the disclosure can be applied independently or be incorporated.

While the disclosure has been described by way of example and in terms of preferred embodiment, it is to be understood that the disclosure is not limited thereto. Those who are skilled in this technology can still make various alterations and modifications without departing from the scope and spirit of this disclosure. Therefore, the scope of the present disclosure shall be defined and protected by the following claims and their equivalents.

What is claimed is:

1. A thermal simulation device, applied to a transaction-level designed chip, wherein the chip includes a plurality of intellectual properties, the thermal simulation device comprising:
   a plurality of thermal-aware transaction-level power model circuits applied for thermal simulation of the chip, corresponding to the plurality of intellectual properties, and configured to generate power information corresponding to the plurality of intellectual properties, and dynamically adjust the power information according to temperature information;
   a simulator, configured to generate the temperature information corresponding to the plurality of intellectual properties according to compatible information;
   a translator, configured to generate the compatible information which is compatible with the simulator; and
   a thermal emulator, configured to trigger the simulator and transmit the temperature information to the intellectual properties,
   wherein each of the intellectual properties is divided into a plurality of grids in advance, wherein each of the grids corresponds to the same or different power weighting,
   wherein when each of the intellectual properties is divided into the plurality of grids in advance, a first maximum temperature difference corresponding to the first number of grids of each of the intellectual properties is computed and a second maximum temperature difference corresponding to the second number of grids of each of the intellectual properties is computed, and a first difference between the first maximum temperature difference and the second maximum temperature difference is computed, wherein the second number is larger than the first number,
   wherein when the first difference is less than or equal to a threshold, the first number is adopted; and when the first difference is greater than the threshold, a third maximum temperature difference corresponding to the third number of grids of each of the intellectual properties is computed; and a second difference between the second maximum temperature difference and the third maximum temperature difference is computed, and a determination is made as to whether the second difference is greater than the threshold, wherein the third number is larger than the second number.

2. The thermal simulation device of claim 1, wherein the thermal-aware transaction-level power model circuit further comprises a thermal code, and the thermal-aware transaction-level power model circuit further generates the power information according to the temperature information through the thermal code.

3. The thermal simulation device of claim 1, wherein each of the thermal-aware transaction-level power model circuits is further configured to adopt a coarse or a fine-grid design method by determining whether each of the intellectual properties is divided into multiple grids.

4. The thermal simulation device of claim 1, wherein each of the thermal-aware transaction-level power model circuits further comprises a look-up table and the look-up table is established according to the relationship between temperature and power of each thermal-aware transaction-level power model circuit.

5. The thermal simulation device of claim 4, wherein each of the thermal-aware transaction-level power model circuits obtains the power information according to the look-up table.

6. The thermal simulation device of claim 1, wherein the simulator is a PSPICE Simulation Engine, a HSPICE Simulation Engine, a Spectra Simulation Engine, or a Nexxim SPICE Simulation Engine.

7. The thermal simulation device of claim 1, wherein the translator generates a resistor-capacitor network of each of the intellectual properties according to floorplan and material of each of the intellectual properties and generates parameter information corresponding to the resistor-capacitor network according to the resistor-capacitor network.

8. The thermal simulation device of claim 7, wherein the translator is further configured to transform the power information to current information, and wherein the compatible information comprises the parameter information and the current information.

9. The thermal simulation device of claim 1, further comprising:
   a decision circuit, configured to determine the chip is a 2 dimension chip or a 3 dimension chip.

10. The thermal simulation device of claim 9, wherein when the chip is the 2 dimension chip, a numerical method or an analytical method is performed.

11. The thermal simulation device of claim 9, wherein the thermal simulation device is applied to different designed models for different time-levels, wherein the design models are Cycle Accurate (CA), Programmer View with Timing (PVT), Programmer View (PV), and untimed.

12. The thermal simulation device of claim 1, wherein the temperature information transmitted to the intellectual properties is implemented in the chip for manufacturing the chip.

13. A thermal simulation method, applied to a transaction-level designed chip, wherein the chip includes a plurality of intellectual properties, the thermal simulation method comprising:
   generating, by a plurality of thermal-aware transaction-level power model circuits applied for thermal simulation of the chip, power information corresponding to the plurality of intellectual properties;
   generating compatible information which is compatible with a simulator;
   generating temperature information corresponding to the plurality of intellectual properties according to the compatible information;
   transmitting the temperature information to the intellectual properties; and
   dynamically adjusting the power information according to the temperature information, wherein each of the intellectual properties is divided into a plurality of grids in advance, wherein each of the grids corresponds to the same or different power weighting, wherein when each of the intellectual properties is divided into the plurality of grids in advance, the thermal simulation method further comprising:

computing a first maximum temperature difference corresponding to the first number of grids of each of the intellectual properties and computing a second maximum temperature difference corresponding to the second number of grids of each of the intellectual properties, wherein the second number is larger than the first number;

computing a first difference between the first maximum temperature difference and the second maximum temperature difference;

determining whether the first difference is larger than a threshold;

adopting the first number when the first difference is less than or equal to a threshold;

computing a third maximum temperature difference corresponding to the third number of grids of each of the intellectual properties when the first difference is greater than the threshold, wherein the third number is larger than the second number;

computing a second difference between the second maximum temperature difference and the third maximum temperature difference; and determining whether the second difference is greater than the threshold.

14. The thermal simulation method of claim 13, further comprising:

generating, by the thermal-aware transaction-level power model circuit, the power information according to the temperature information through a thermal code.

15. The thermal simulation method of claim 13, further comprising:

adopting a coarse or a fine-grid design method by determining whether each of the intellectual properties is divided into multiple grids.

16. The thermal simulation method of claim 13, wherein each of the thermal-aware transaction-level power model circuits comprises a look-up table and the look-up table is established according to the relationship between temperature and power of each thermal-aware transaction-level power model circuit.

17. The thermal simulation method of claim 16, further comprising:

obtaining the power information according to the look-up table.

18. The thermal simulation method of claim 13, wherein the simulator is a PSPICE Simulation Engine, a HSPICE Simulation Engine, a Spectra Simulation Engine, or a Nexxim SPICE Simulation Engine.

19. The thermal simulation method of claim 13, further comprising:

generating a resistor-capacitor network of each of the intellectual properties according to floorplan and material of each of the intellectual properties; and generating parameter information corresponding to the resistor-capacitor network according to the resistor-capacitor network.

20. The thermal simulation method of claim 19, further comprising:

transforming the power information to current information, and wherein the compatible information comprises the parameter information and the current information.

21. The thermal simulation method of claim 13, further comprising:

a decision circuit, configured to determine the chip is a 2 dimension chip or a 3 dimension chip.

22. The thermal simulation method of claim 21, further comprising:

performing a numerical method or an analytical method when the chip is the 2 dimension chip.

23. The thermal simulation method of claim 13, wherein the thermal simulation method is applied to different designed models for different time-levels, wherein the designed models are Cycle Accurate (CA), Programmer View with Timing (PVT), Programmer View (PV), and untimed.

24. The thermal simulation method of claim 13, wherein the temperature information transmitted to the intellectual properties is implemented in the chip for manufacturing the chip.

* * * * *